United States Patent
Cao et al.

(10) Patent No.: US 8,418,015 B2
(45) Date of Patent: Apr. 9, 2013

(54) METHOD, APPARATUS AND SYSTEM FOR CODING AND DECODING OF LDPC CODES

(75) Inventors: Yanbo Cao, Beijing (CN); Hongqiang Li, Beijing (CN); Lu An, Beijing (CN); Yuanxin Qiao, Beijing (CN); Jianxun Sun, Beijing (CN); Yuxin Dong, Beijing (CN)

(73) Assignee: China Academy of Telecommunications Technology, Beijing (CN)

(*) Notice: Subject to any disclaimer, the term of this patent is extended or adjusted under 35 U.S.C. 154(b) by 0 days.

(21) Appl. No.: 12/663,665

(22) PCT Filed: Jun. 6, 2008

(86) PCT No.: PCT/CN2008/001109
§ 371 (c)(1),
(2), (4) Date: Apr. 1, 2010

(87) PCT Pub. No.: WO2008/151516
PCT Pub. Date: Dec. 18, 2008

(65) Prior Publication Data
US 2010/0211841 A1    Aug. 19, 2010

(30) Foreign Application Priority Data

Jun. 8, 2007  (CN) .......................... 2007 1 0100362
Jun. 8, 2007  (CN) .......................... 2007 1 0100363

(51) Int. Cl.
*H04L 1/18* (2006.01)

(52) U.S. Cl. ...................................... 714/748; 714/751

(58) Field of Classification Search ........................ None
See application file for complete search history.

(56) References Cited

U.S. PATENT DOCUMENTS

| | | | |
|---|---|---|---|
| 7,139,959 B2 | 11/2006 | Hocevar | |
| 7,930,622 B2* | 4/2011 | Oh et al. | 714/801 |
| 2007/0089016 A1* | 4/2007 | Bhatt et al. | 714/752 |

(Continued)

FOREIGN PATENT DOCUMENTS

| | | |
|---|---|---|
| CN | 1778063 A | 5/2006 |
| CN | 1310433 C | 4/2007 |
| CN | 1949694 A | 4/2007 |

OTHER PUBLICATIONS

International Search Report for International Application No. PCT/CN2008/001109 mailed Sep. 18, 2008.

*Primary Examiner* — Gabriel Chu
(74) *Attorney, Agent, or Firm* — Hoffman & Baron, LLP

(57) ABSTRACT

The present invention discloses a method, an apparatus and a system for low-density parity-check (LDPC) coding and decoding. The coding method includes the following steps: constructing each layer of a check matrix of a layered LDPC code used as an error correcting code; when data is initially sent by a data transmitting terminal, performing first-layer-coding of the data to be sent by using the first layer of a check matrix of the LDPC code, sending the first-layer-coded data; when data for (n−1)th retransmission is sent by the data transmitting terminal, performing nth-layer-coding of the data by using the nth layer of a check matrix of the LDPC code, sending the nth-layer-coded data, wherein n is an integer no less than 2. It is possible to reduce the system overhead, decrease the decoding delay, and improve the decoding performance by using the technical solution of the present invention which is also adapted to high-speed data services.

12 Claims, 6 Drawing Sheets

U.S. PATENT DOCUMENTS

2007/0162811 A1* 7/2007 Matsumoto ............... 714/749
2007/0277082 A1* 11/2007 Matsumoto ............... 714/801
2009/0313520 A1* 12/2009 Chung et al. ............... 714/751
2010/0281327 A1* 11/2010 Okamura ............... 714/751
2011/0239075 A1* 9/2011 Xu et al. ............... 714/751

* cited by examiner

METHOD, APPARATUS AND SYSTEM FOR CODING AND DECODING OF LDPC CODES

TECHNICAL FIELD

The present invention relates to the communication technology, particularly to a method, an apparatus and a system for coding and decoding of low-density parity-check (LDPC) codes.

BACKGROUND ART

The current communication technology is most strikingly characterized in the complexity and time variation of channels of the communication system as well as error codes brought forth thereby. Therefore, automatic repeat request (ARQ) and forward error correcting (FEC) are usually applied at present for error control. ARQ and FEC are technologies for error control by means of error detecting code and error correcting code, respectively. The principle of ARQ is that a receiving terminal feeds back information through reverse channel, so that the transmitting terminal will not stop retransmitting a data packet with the checked error, until the receiving terminal has judged a correct reception; while the principle of FEC is that an error correcting code is coded and sent from the transmitting terminal and decoded by the receiving terminal, so that an error in the codeword is corrected automatically. ARQ has a better correction capability, but requires reverse channel and is weak in real-timing of communication. On the contrary, FEC has good real-timing and its transceiver control system is simple, but the error correcting code is designed under the worst channel condition and therefore coding efficiency is low.

An HARQ system has the advantages of the above two error control methods, wherein the sent error correcting code has certain capabilities of error correcting, and the receiving terminal informs the transmitting terminal of retransmission only in the case where the error correcting capability is exceeded. To some extent, the deficiencies of communication hysteresis in ARQ and decoding complexity in FEC are prevented, so that higher spectrum efficiency is achieved.

TURBO code is applied commonly in the current HARQ mechanism. The TURBO code has the following deficiencies:

1. It is impossible to check it by itself, and it is necessary to add cyclic redundancy check code (CRC) to check bits, which increases the system costs.
2. The decoding is complex so that the amount of caching data is huge, and the iteration number of decoding is limited so that the decoding delay is long, therefore it is not adapted to real-time services.
3. The performance is deficient during the coding and decoding of codes exclusive of short ones.
4. For high-speed downlink transmission services, the processing workloads of the algorithm concentrate on the mobile station, which increases the complexity for carrying out the mobile station, thus the mobile station has high costs and power consumption and short standby time.

SUMMARY OF THE INVENTION

The object of the present invention is to provide a method, an apparatus and a system for coding and decoding of LDPC codes, so as to overcome one or more deficiencies of the above mentioned prior art. The technical solution of the present invention has one or more following advantages: reducing the system costs, decreasing the decoding delay, improving the decoding performance, and being adapted to high-speed data services.

In order to achieve the above mentioned object, the present invention provides a method for coding LDPC codes, which comprises the following steps:

A. constructing each layer of check matrix of a layered LDPC code used as an error correcting code;
B. prior to initially sending data by a data transmitting terminal, performing first-layer-coding of the data to be sent by using the first layer of a check matrix of the LDPC code, sending the first-layer-coded data;
C. prior to sending data for (n−1)th retransmission by the data transmitting terminal, performing nth-layer-coding of the data by using the nth layer of the check matrix of the LDPC code, sending the nth-layer-coded data, wherein n is an integer no less than 2.

According to an embodiment of the present invention, the method for constructing each layer of the check matrix of the layered LDPC code in step A is: a method for constructing a quasi-cyclic LDPC code; and the step A includes specifically:

A1. setting parameters of a mother matrix;
A2. constructing the mother matrix $M_0$ based on the set parameters; constructing a base check matrix $H_0$ based on the mother matrix $M_0$ by power method for constructing quasi-cyclic code, the base check matrix $H_0$ serving as the first layer of the check matrix;
A3. setting an initial value of m to be 2;
A4. constructing a mother matrix $M_{m-1}$ of the mth layer of a check matrix;
A5. generating a cyclic permutation matrix by power method to substitute a selected block in $M_{m-1}$, so that the mth layer of a check matrix $H_{m-1}$ is obtained;
A6. judging whether m reaches a predetermined value, if so, terminating this procedure; else, increasing the value of m by 1 and returning back to step A4.

According to an embodiment of the present invention, the method for constructing each layer of the check matrix of the layered LDPC code is a bit-filling method or a progressive edge-growth algorithm.

According to an embodiment of the present invention, the coding in step C is performed for the coded data of all the previous n−1 layers;

The nth-layer-coding of the data by using the nth layer of a check matrix of the LDPC code in step C is specifically: determining structures of previous n layers of check matrix $H_{m-1}$ in accordance with the formula:

$$H_{m-1} = \begin{pmatrix} A & B & T & 0 & 0 & 0 \\ C & D & E & 0 & 0 & 0 \\ Q_{11} & Q_{12} & Q_{13} & P_1 & 0 & 0 \\ & & \cdots & & & \\ Q_{m-1,1} & Q_{m-1,2} & Q_{m-1,3} & \cdots & Q_{m-1,m+1} & P_{m-1} \end{pmatrix},$$

wherein m=n, and the nth layer of the check matrix is the last line of $H_{m-1}$; determining a coding result $p_{m+1}^T$ of the mth layer in accordance with the formula $p_{m+1}^T = P_{m-1}^{-1}(Q_{m-1,1}s^T + Q_{m-1,2}p_1^T + Q_{m-1,3}p_2^T + \ldots + Q_{m-1,m+1}p_m^T)$, wherein s is a known information bit, $p_1, p_1, p_3, \ldots, p_m$ are known coding results of upper-layer code relative to the mth layer, the superscript T represents transpose, and the superscript −1 represents inversion.

According to an embodiment of the present invention, the LDPC code of said each layer is block-type LDPC code.

The present invention further provides a computer program for executing the above mentioned coding method.

The present invention further provides a computer-readable medium for carrying the computer program for executing the above mentioned coding method.

The present invention further provides a LDPC decoding method comprising the following steps:

D. pre-constructing and storing each layer of a check matrix of a layered LDPC code;

E. after a data receiving terminal receives initially sent data of first layer, decoding the received data by using the first layer of the check matrix of the LDPC code and judging the decoding result, informing the data transmitting terminal of retransmit the data in the case of incorrect decoding;

F. after the data receiving terminal receives data for (n−1)th retransmission, layered-decoding the received data by using the nth layer of the check matrix of the LDPC code; judging the decoding result, informing the data transmitting terminal of retransmitting the data in the case of incorrect decoding, wherein n is an integer no less than 2.

According to an embodiment of the present invention, the step F is specifically:

F1. decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer using the nth layer of the check matrix of the LDPC code;

F2. judging the decoding result of the step F1, cascading the data of the previous n−1 layers and the data of the nth layer in the case of incorrect decoding, combining the previous n−1 layers of the check matrix of the LDPC code and the nth layer of the check matrix, decoding the cascaded data of the previous n−1 layers and the nth layer by using the combined check matrix, and judging the decoding result, informing the data transmitting terminal of retransmitting the data in the case of incorrect decoding.

According to an embodiment of the present invention, the step F is specifically:

F3. cascading the data of the previous n−1 layers with the data of the nth layer, combining the previous n−1 layers of the check matrix and the nth layer of the check matrix, and decoding the cascaded data by using the combined check matrix.

According to an embodiment of the present invention, said method further includes: judging whether channel quality of a current channel reaches a predetermined standard, if so, the step F is specifically:

F1. decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code;

F2. judging the decoding result of the step F1, cascading the data of the previous n−1 layers and the data of the nth layer, combining the previous n−1 layers of the check matrix of the LDPC code and the nth layer of the check matrix in the case of incorrect decoding, decoding the cascaded data of the previous n−1 layer and the nth layer by using the combined check matrix, and judging the decoding result, informing the data transmitting terminal of retransmitting the data in the case of incorrect decoding;

if the channel quality of the current channel fails to reach the predetermined standard, the step F is specifically:

F3. cascading the data of the previous n−1 layers with the data of the nth layer, combining the previous n−1 layers of the check matrix and the nth layer of the check matrix of the LDPC code, and decoding the cascaded data by using the combined check matrix.

According to an embodiment of the present invention, the constructing method of the step D is: a method for constructing a quasi-cyclic LDPC code; and the step D includes specifically:

D1. setting parameters of a mother matrix;

D2. constructing the mother matrix $M_0$ based on the set parameters; constructing a base check matrix $H_0$ based on the mother matrix $M_0$ by power method for constructing quasi-cyclic code, the base check matrix $H_0$ serving as the first layer of the check matrix;

D3. setting an initial value of m to be 2;

D4. constructing a mother matrix $M_{m-1}$ of the mth layer of a check matrix;

D5. generating a cyclic permutation matrix by power method to substitute a selected block in $M_{m-1}$, so that the mth layer of a check matrix $H_{m-1}$ is obtained;

D6. judging whether m reaches a predetermined value, if so, terminating this procedure; else, increasing the value of m by 1 and returning back to step D4.

According to an embodiment of the present invention, the method for constructing each layer of the check matrix of the layered LDPC code is a bit-filling method or a progressive edge-growth algorithm.

According to an embodiment of the present invention, the LDPC code of said each layer is block-type LDPC code.

The present invention further provides a computer program for executing the above mentioned decoding method.

The present invention further provides a computer-readable medium for carrying the computer program for executing the above mentioned decoding method.

The present invention further provides a communication system based on LDPC coding which comprises at least one data transmitting terminal and at least one data receiving terminal, the data receiving terminal including a coding device for constructing each layer of a check matrix of a layered LDPC code used as an error correcting code and, prior to initially sending data by a data transmitting terminal, performing first-layer-coding of the data to be sent by using a first layer of a check matrix of the LDPC code, sending the first-layer-coded data and, prior to sending data for (n−1)th retransmission by the data transmitting terminal, performing nth-layer-coding of the data by using the nth layer of a check matrix of the LDPC code, sending the nth-layer-coded data;

the data receiving terminal including a decoding device for pre-constructing and storing each layer of a check matrix of a layered LDPC code and, after a data receiving terminal receives initially sent data of first layer, decoding the received data by using the first layer of the check matrix of the LDPC code and judging the decoding result, informing the data transmitting terminal of retransmitting the data in the case of incorrect decoding and, after the data receiving terminal receives data for (n−1)th retransmission, layered-decoding the received data by using the nth layer of the check matrix of the LDPC code; judging the decoding result, and informing the data transmitting terminal of retransmitting the data in the case of incorrect decoding, wherein n is an integer no less than 2.

The present invention further provides an LDPC coding device, comprising:

an error correcting code constructing unit for constructing each layer of a check matrix of a layered LDPC code used as an error correcting code; a coding unit provided at a data transmitting terminal for layered-coding data for pre-transmission by using the layered LDPC code constructed by the error correcting code constructing unit.

According to an embodiment of the present invention, the coding unit includes a coding module for coding and a hierarchy determining unit for determining hierarchy of coding: in the case of initially sent data, the coding module being triggered to perform first-layer-coding of said data by using the first layer of a check matrix of the LDPC code; in the case of data for (n−1)th retransmission sent by data transmitting terminal, hierarchy n being determined, the coding module being triggered to perform nth-layer-coding of coded data of the previous n−1 layers by using the nth layer of a check matrix of the LDPC code, wherein n is an integer no less than 2.

According to an embodiment of the present invention, said each layer of the LDPC code is block-type LDPC code.

The present invention further provides an LDPC decoding device, comprising:
an error correcting code constructing unit for constructing each layer of a check matrix of a layered LDPC code used as an error correcting code;
a decoding unit provided at a data receiving terminal for layered-decoding the received data by using the layered LDPC code constructed by the error correcting code constructing unit.

According to an embodiment of the present invention, the decoding unit includes specifically a decoding module, a hierarchy determining unit, and a decoding result judging unit;
the decoding unit being used for decoding; the hierarchy determining unit being used for determining hierarchy of decoding, after the data receiving terminal receives the initially sent data, the decoding module being triggered to layered-decoding the received data by using a first layer of a matrix of the LDPC code; after the data receiving terminal receives data for (n−1)th retransmission, a hierarchy n being determined, the decoding module being triggered to layered-decoding the received data by using the nth layer of a matrix of the LDPC code, wherein n is an integer no less than 2; the decoding result judging unit being used for judging the decoding result, the data transmitting terminal being informed to retransmit the data in the case of incorrect decoding.

According to an embodiment of the present invention, the decoding module further includes a first decoding module and a second decoding module, and the decoding result judging unit further includes a first decoding result judging unit and a second decoding result judging unit, wherein:
the first decoding module is used for decoding data of previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code;
the first decoding result judging unit is used for judging the decoding result, triggering the second decoding module in the case of incorrect decoding;
the second decoding module is used for cascading the data of the previous n−1 layers and the nth layer, combining the previous n−1 layers of the check matrix of the LDPC code and the nth layer of the check matrix, decoding the cascaded data of the previous n−1 layers and the nth layer by using the combined check matrix, and outputting the decoding result to the second decoding result judging unit;

the second decoding result judging unit is used for judging the decoding result, informing the data transmitting terminal of retransmitting the data in the case of incorrect decoding.

According to an embodiment of the present invention, the LDPC code of said each layer is block-type LDPC code.

The present invention further provides an electronic device which is comprising:
at least one data processor, at least one memory connected with the data processor, and a coder connected with the data processor, wherein:
the coder is used for constructing each layer of a check matrix of a layered LDPC code used as an error correcting code and; prior to initially sending data, performing first-layer-coding of the data to be sent using the first layer of a check matrix of the LDPC code and; prior to sending data for (n−1)th retransmission, performing nth-layer-coding of the data by using the nth layer of a check matrix of the LDPC code.

According to an embodiment of the present invention, the method for constructing the layered LDPC is: a method for constructing a quasi-cyclic LDPC code, specifically comprising the following steps:
G1. setting parameters of a mother matrix;
G2. constructing the mother matrix $M_0$ based on the set parameters; constructing a base check matrix $H_0$ based on the mother matrix $M_0$ by power method for constructing quasi-cyclic code, the base check matrix $H_0$ serving as the check matrix of the first layer;
G3. setting an initial value of m to be 2;
G4. constructing a mother matrix $M_{m-1}$ of the mth layer of a check matrix;
G5. generating a cyclic permutation matrix by power method to substitute a selected block in $M_{m-1}$, so that the mth layer of a check matrix $H_{m-1}$ is obtained;
G6. judging whether m reaches a predetermined value, if so, terminating this procedure; else, increasing the value of m by 1 and returning back to step G4.

The present invention further provides an electronic device, comprising: at least one data processor, at least one memory connected with the data processor, and a decoder connected with the data processor, wherein
the decoder is used for pre-constructing and storing each layer of a check matrix of a layered LDPC code and, after a data receiving terminal receives initially sent data of first layer, decoding the received data by using the first layer of the check matrix of the LDPC code and judging the decoding result, informing the data transmitting terminal of retransmitting the data in the case of incorrect decoding, and, after the data receiving terminal receives data for (n−1)th retransmission, layered-decoding the received data by using the nth layer of the check matrix of the LDPC code; judging the decoding result, and informing the data transmitting terminal of retransmitting the data in the case of incorrect decoding, wherein n is an integer no less than 2.

According to an embodiment of the present invention, after reception of the data for (n−1)th retransmission, the following steps are included:
H1. decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code;
H2. judging the decoding result of the step H1, cascading the data of the previous n−1 layers and the data of the nth layer in the case of incorrect decoding, combining the previous n−1 layers of the check matrix of the LDPC code and the nth layer of the check matrix, decoding the cascaded data of the previous n−1 layers and the nth layer by using the combined check matrix, and judging the decoding result, and informing the data transmitting terminal of retransmitting the data in the case of incorrect decoding.

According to an embodiment of the present invention, after reception of the data for (n−1)th retransmission, the following step is included:

H3. cascading the data of the previous n−1 layers with the data of the nth layer, combining the previous n−1 layers of the check matrix and the nth layer of the check matrix, and decoding the cascaded data by using the combined check matrix.

According to an embodiment of the present invention, after reception of the data for (n−1)th retransmission, the following step is further included: judging whether channel quality of a current channel reaches a predetermined standard, conducting the following step if so:

H1. decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code;

H2. judging the decoding result of the step H1, cascading the data of the previous n−1 layers and the data of the nth layer in the case of incorrect decoding, combining the previous n−1 layers of the check matrix of the LDPC code and the nth layer of the check matrix, decoding the cascaded data of the previous n−1 layers and the nth layer by using the combined check matrix, and judging the decoding result, informing the data transmitting terminal of retransmitting the data in the case of incorrect decoding;

and cascading the data of the previous n−1 layers with the data of the nth layer, combining the previous n−1 layers of the check matrix and the nth layer of the check matrix of the LDPC code, and decoding the cascaded data by using the combined check matrix if the channel quality of the current channel fails to reach the predetermined standard.

According to an embodiment of the present invention, the electronic device comprises a mobile electronic device.

According to an embodiment of the present invention, the electronic device comprises a mobile phone.

According to an embodiment of the present invention, the electronic device comprises a base station.

According to an embodiment of the present invention, the electronic device comprises an access point AP of a wireless local network.

The technical solution of the present invention has one or more of the following advantages:

1. The error correcting code applied in the present invention is an LDPC code, which is the optimized error correcting code in present, so that it is possible to construct more flexible check matrix having lower range of code rate and check the decoding without CRC check each time when the iteration-decoding is finished, so that the system costs are reduced. LDPC coding includes various quasi-linear coding methods, wherein the application of parallel decoding algorithm decreases the decoding delay greatly, and it is greatly superior to the current TURBO code in decoding processing speed and buffering and has a better performance on coding and decoding codes exclusive of short ones. Regarding the high speed downlink data, LDPC code allows the coding work with higher complexity to be finished at the base station and the coding work with lower complexity to be finished by the mobile station, thereby simplifying the processing at the mobile station, reducing the costs and power consumption and shortening the standby time.

2. In the present invention a layered LDPC coding/decoding method is applied, wherein the decoding result of an upper layer is not influenced by a lower decoding; when a correct decoding of the data of the upper layer is received at the receiving terminal, it is unnecessary that the transmitting terminal performs coding of a next layer, so that the amount of calculation for coding, coding delay and requirement on buffer at the transmitting terminal is reduced.

3. Each layer of the check matrix in the present invention comprises a quasi-undertriangular matrix, so that coding of each layer has a quasi-linear complexity, which is relative low.

4. In the present invention, regarding decoding at the receiving terminal, multilayer cascaded data are decoded by using a lower layer of check matrix so as to reduce the decoding complexity, and it is also possible to obtain the complete coding gain by decoding with a complete check matrix. Hence, the decoding method of the present invention is flexible, and the specific decoding mode is optionally selectable as required. Especially in the case of a relative good channel quality of the communication channel, it will reduce the processing complexity greatly.

5. The layered coding method according to the present invention is universal, hence it allows the check matrix to be constructed by a quasi-cyclic LDPC coding method, or by a bit-filling method, a progressive edge-growth (PEG) method and similar derived methods.

6. Due to the application of LDPC code in the present invention, lengths of the coding and the transmission block can be adjusted by perforation or repetition to perform service adaptation if the coding length and the length of the transmission block fail to meet the requirements of service applications; thus, the present invention is adapted to various service applications and has a broad range of adaptation. The present invention is not only applicable to mobile communication but also has an application aspect in the fields such as file transmission, Internet etc.

MODE OF CARRYING OUT THE INVENTION

Now, the present invention is further explained in detail by the embodiments and drawings.

The core of the coding method of the present invention is to use a layered-low parity-check (LDPC) code as an error correcting code, so as to layered-code the data for pre-transmission by the LDPC code at the data transmitting terminal.

Figure 1:
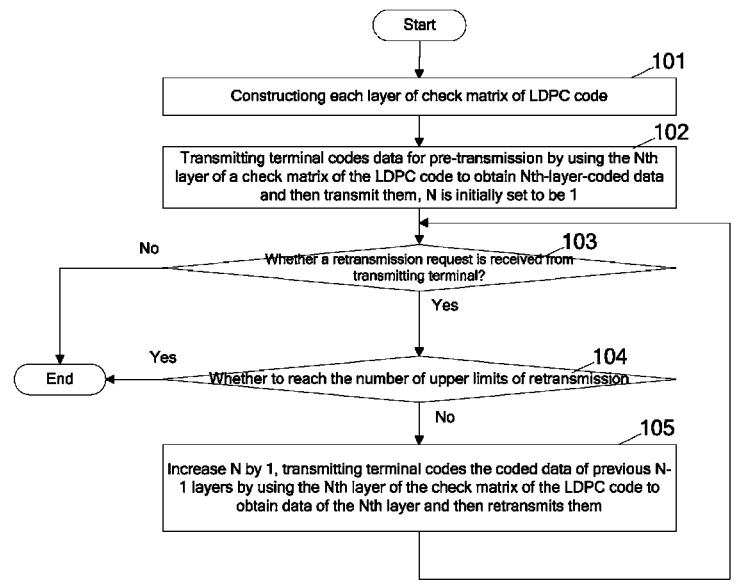
FIG. 1 is a flow chart of an embodiment of coding of the present invention.

FIG. 1 is a flow chart of the embodiment of the coding method of the present invention. See FIG. 1, said flow includes:

Step 101, constructing each layer of a check matrix of the layered LDPC code in accordance with service and retransmission HARQ mechanism;

Step 102, the data transmitting terminal coding the data for pre-transmission by using the Nth layer of a check matrix of the LDPC code to obtain data of the Nth layer, and then sending them, The initial value of N is 1, and this step is just coding the data for pre-transmission by using the first layer of the check matrix of the LDPC code to obtain the data of the first layer. In the step 102, it is unnecessary to perform second-layer-coding unless the data transmitting terminal receives a retransmission request, viz. NACK message;

Step 103, the data transmitting terminal judging whether a retransmission request, viz. NACK message, from the data receiving terminal is received, and conducting Step 104 if so, else, terminating the flow;

Step 104, judging whether to reach the number of an upper limits of retransmission, terminating the flow if so, else, conducting Step 105, Step 104 is an optional step, and Step 105 may also be conducted directly after the reception of the NACK request in Step 103;

Step 105, increasing N by 1, the data transmitting terminal performing Nth-layer-coding, i.e. coding the coded data of previous N−1 layers by using the Nth layer of the check matrix of the LDPC code to obtain data of Nth layer, and then sending them. After sending the data of the (N−1)th layer, the data transmitting terminal may cache it for the coding of the Nth layer, and delete them if no NACK request is received.

For example, for second-layer-coding, the coding result of the first layer is coded by using the second layer of the check matrix of the LDPC; for third-layer-coding, the coding result of the second layer and the previous coding results are coded by using the third layer of the check matrix of the LDPC; and the coding of each layer thereafter is performed by analogy.

The coding method of the present invention does not limit the number of layers of the layered LDPC code, and the number of layers can be set according to the requirement of services.

The core of the decoding method of the present invention is to use a low-density parity-check (LDPC) code as an error correcting code, so as to layered-code the data for pre-transmission by the LDPC code at the data transmitting terminal and to perform layered-decoding of the received data at the data receiving terminal by using the LDPC code.

To achieve an optimized technical effect, a layered LDPC code is used for decoding in the following embodiment.

In the following embodiment, the coding solution of the present invention is described more clearly and completely though the detailed constructing theory and detailed constructing method of the LDPC code.

Figure 2:
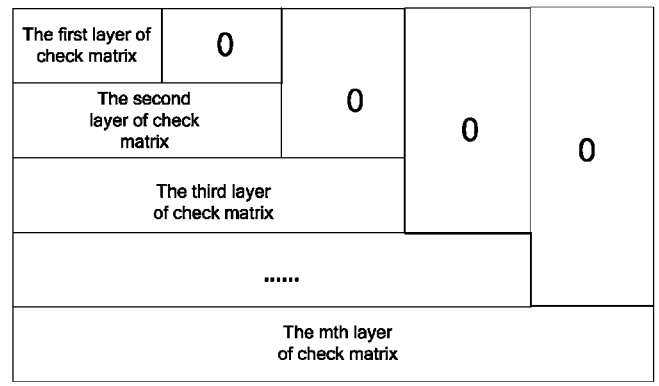
FIG. 2 is a basic structure diagram of a layered LDPC code.

FIG. 2 is a basic structure diagram of the layered LDPC code. As shown in FIG. 2, "O" represents zero matrix, the number of columns in each layer of the matrix is the length of code having been coded, the number of rows is the check bit length, and the length of information bit is the number of column minus the number of rows.

The LDPC code of the present invention is constructed based on a specific HARQ mechanism. Supposed that the relative parameters based on the HARQ transmission solution in this embodiment are: a length of information bit of 508 bit, a first-layer-coding length of 1016 bit, a second-layer-coding length of 1778−1016=762 bit, and a third-layer-coding length of 2540−1778=762 bit.

In the present invention, each layer of the check matrix can be constructed specifically by quasi-cyclic LDPC code method (QC LDPC), and other constructing methods, such as a bit-filling method, PEG etc., may also be used for the construction.

QC LDPC code is used in this embodiment for constructing the check matrix. QC LDPC code is a kind of LDPC codes composed of block cyclic permutation matrix with high efficiency and is easy to store. In this embodiment, a kind of QC LDPC codes with low complexity are applied.

A quasi cyclic code in the form of a quasi-undertriangular matrix, called block-type LDPC code (B-LDPC code), is used in this embodiment in the case of keeping the performance of the QC LDPC code and the validity of coding. Here supposed the check matrix of the B-LDPC code is H and H is an mp×np order matrix that is defined according to the following formula (1):

$$H = \begin{bmatrix} P^{a_{11}} & P^{a_{12}} & \ldots & P^{a_{1(n-1)}} & P^{a_{1n}} \\ P^{a_{21}} & P^{a_{22}} & \ldots & P^{a_{2(n-1)}} & P^{a_{2n}} \\ \vdots & \vdots & \ldots & \vdots & \vdots \\ P^{a_{m1}} & P^{a_{m2}} & \ldots & P^{a_{m(n-1)}} & P^{a_{mn}} \end{bmatrix} \quad (1)$$

Here for easily understanding, H is divided into two parts: information part $H_i$ and check part $H_p$, i.e. $H=[H_i \; H_p]$. Here, $H_p$ is defined as a quasi-undertriangular matrix. H can be set as an mp×(m+k)p order check matrix shown by the following formula (2):

$$H = [H_i \mid H_p] \quad (2)$$

$$= \begin{bmatrix} P^{b_1} & I & 0 & \ldots & 0 & 0 \\ 0 & P^{b_2} & I & \ldots & 0 & 0 \\ \vdots & 0 & P^{b_{13}} & \ldots & 0 & 0 \\ H_i P^y & \vdots & \vdots & \ldots & \vdots & \vdots \\ \vdots & \vdots & \vdots & \ldots & I & 0 \\ 0 & 0 & 0 & \ldots & P^{b_{m-1}} & I \\ P^x & 0 & 0 & \ldots & 0 & P^{b_m} \end{bmatrix}$$

Wherein P is a p×p order cyclic permutation matrix, viz. a cyclic shift matrix of unit matrix, a length of coded information bit is (n−m)p, a length of check bit is mp, and a code length is np, wherein p is the number of dimension of the cyclic permutation matrix and is usually a prime number. The LDPC code having a check matrix as shown by formula (2) is called as block-type LDPC code (B-LDPC code).

In this embodiment, Richardson-Urbanke coding method may be applied to the B-LDPC code, for resolving H into the blocked matrix shown by the following formula (3):

$$H = \begin{bmatrix} A & B & T \\ C & D & E \end{bmatrix} \quad (3)$$

Wherein A is an (m−1)p×kp dimensional blocked matrix, B is an (m−1)p×p dimensional blocked matrix, T is an (m−1)p×(m−1)p dimensional undertriangular blocked matrix, C is a p×kp dimensional blocked matrix, $D=P^x$ is a p×p dimensional blocked matrix, E is an p×(m−1)p dimensional blocked matrix, and n=m+k.

Supposed $H_p$ is nonsingular, it can be known by Gauss Elimination Method that $\phi=-ET^1B+D$ is nonspecific. As what applied in this embodiment is a system code, c may be a set of code words defined by H, then $Hc^T=0^T$, therefore, the following equations (4) and (5) are obtained:

$$As^T+Bp_1^T+Tp_2^T=0 \tag{4}$$

$$(-ET^{-1}A+C)s^T+-\phi^{-1}(-ET^{-1}B+D)p_1^T=0 \tag{5}$$

wherein s represents the information part, $p_1$ and $p_2$ represent the check parts, and the lengths of check codes are p and (m−1)p, respectively, then the following formulae (6) and (7) are obtained:

$$p_1^T=-\phi^{-1}(ET^{-1}A+C)s^T=-\phi^{-1}(-ET^{-1}As^T+Cs^T) \tag{6}$$

$$p_2^T=-T^{-1}(As^T+Bp_1^T) \tag{7}$$

As the matrix $\phi^{-1}$ is usually a non-sparse matrix, $p_1$ has a complexity of $O(N)+O(p^2)$, wherein N=(np) is the code length. However, if $\phi$ is a unit matrix, the complexity of the coding is linear.

In order to calculate $\phi$, H in the formulae (2) and (3) is considered. It is easy to know that $T^1$ may be recorded as a matrix as formula (8):

$$T^{-1} = \begin{bmatrix} I & 0 & 0 & \cdots & 0 & 0 & 0 \\ P^{b_2} & I & 0 & \cdots & 0 & 0 & 0 \\ P^{(2,3)} & P^{b_3} & I & \cdots & 0 & 0 & 0 \\ \vdots & \vdots & \vdots & \cdots & \vdots & 0 & 0 \\ P^{(2,m-2)} & P^{(3,m-2)} & P^{(4,m-2)} & \cdots & P^{b_{m-2}} & I & 0 \\ P^{(2,m-1)} & P^{(3,m-1)} & P^{(4,m-1)} & \cdots & P^{(m-2,m-1)} & P^{b_{m-1}} & I \end{bmatrix} \tag{8}$$

wherein $$P^{(i,j)} = \prod_{k=i}^{j} P^{b_k} = P^{b_i+b_{i+1}+\cdots+b_j} \tag{9}$$

Due to the following equations (10) and (11), $$B^T=\lfloor (P^{b_1})^T 0 \ldots (P^{b_l})^T 0 \ldots 0 \rfloor \tag{10}$$

$$E=\lfloor 00 \ldots 0 P^{b_m} \rfloor \tag{11}$$

The formula (12) can be obtained:

$$ET^{-1}B=P^{(l,m)}+P^{(l+1,m)}P^y \tag{12}$$

wherein $P^y$ is located at the lth block of B, l is usually about ½ of m.

If x and y are selected according to the formula (13):

$$x \equiv \sum_{i=1}^{m} b_i \bmod p \text{ and } y \equiv p - \left(\sum_{i=l+1}^{m} b_i \bmod p\right) \tag{13}$$

or selected according to the formula (14):

$$\sum_{i=1}^{m} b_i \equiv 0 \bmod p \text{ and } x \equiv y + \sum_{i=l+1}^{m} b_i \bmod p \tag{14}$$

then matrix $\phi=-ET^1B+D$ is just a unit matrix.

A preferable constructing method of B-LDPC code is shown by the following Steps 21-28:

Step 21, setting a degree distribution rule for a B-LDPC code based on the density evolution theory, that is. a degree distribution function is determined, m row blocks and n=(m+k) column blocks are set and dimension p of the cyclic permutation matrix is set, wherein p is a prime number. $f_1$ is set as the distribution of variable nodes connected with i check nodes, then the dimension of the cyclic permutation matrix is ignored, here $$f_2 = \frac{m-1}{n} \text{ and } f_i = \frac{p_i}{n} \text{ for } 3 \le i \le m.$$

Here $p_1$ is a non negative integer, $p_3 \ge 1$, and $$\sum_{i=2}^{m} f_i = 1 \tag{15}$$

Step 22, under the condition that the fixed m×n order mother matrix M has a right half $M_p$ as shown in formula (16), constructing the left half $M_i$ of the mother matrix M by the bit-filling method or PEG method basing on the degree distribution rule in Step 21, allowing M for having a periphery as long as possible and a number of short block rings as little as possible, determining the mother matrix M in the form as shown by the following formula (16):

$$M = \lfloor M_i \mid M_p \rfloor \tag{16}$$

$$= \begin{bmatrix} 1 & 1 & 0 & \cdots & 0 & 0 \\ 0 & 1 & 1 & \cdots & 0 & 0 \\ \vdots & 0 & 1 & \cdots & 0 & 0 \\ M_i 1 & \vdots & \vdots & \cdots & \vdots & \vdots \\ \vdots & \vdots & \vdots & \cdots & 1 & 0 \\ 0 & 0 & 0 & \cdots & 1 & 1 \\ 1 & 0 & 0 & \cdots & 0 & 1 \end{bmatrix}$$

$H_i$ and $H_p$ in the check matrix of formula (2) are obtained respectively by substituting the position of "1" in $H_i$ and $H_p$ of the mother matrix M with the cyclic permutation matrix;

Step 23, supposed the check part $H_p$ of the check matrix is as shown in formula (2), generating $P^{b_i}$ by the power method for constructing quasi-cyclic code to meet the requirement on the periphery length, selecting $p^x$ and $p^y$ to satisfy the formula (13) or (14), causing $\phi$ to be a unit matrix;

Step 24, initializing $H=[0H_p]$, wherein 0 is an mp×kp order zero matrix.

Step 25, constructing $P^i$ by the power method for constructing quasi-cyclic code to substitute the position block in H corresponding to each "1" having a column weight of 3 in the matrix $M_i$, wherein $0 \le i \le p-1$;

Step 26, selecting a position of "1" in the mother matrix M in each case in Step 25, selecting a cyclic permutation matrix by the power method for generating a quasi-cyclic code in the case that a structure of the B-LDPC code is not changed, and adding the selected cyclic permutation matrix into selected position, thereby updating the corresponding position block in H, and setting a corresponding periphery as long as possible and a number of short block rings as little as possible if it is allowed;

Step 27, repeating Step 25 and Step 26, till each "1" having a column weight of 3 in the mother matrix is substituted by a cyclic permutation matrix;

Step 28, for each column weight j>3, repeating the same Step 25, Step 26, and Step 27;

In the above mentioned Step 23, $M_i$ in the mother matrix M is constructible by various methods, and a bit-filling method or a PEG method may be used to construct the m×n order mother matrix in this embodiment, so that the mother matrix has a periphery as long as possible.

Next, each step in the embodiment according to FIG. 1 is described in detail based on the above mentioned basic concepts and theoretical description.

The first step is: constructing each layer of a check matrix of a layered LDPC code in accordance with service and retransmission HARQ solution.

Constructing a layered structure of the LDPC code is the key to ensure the layered coding and decoding characteristic, not only the coding of a lower layer should be ensured not to influence the coding of an upper layer, but also the coding should be ensured to have a linear complexity, in addition, the performance of the coding solution should also be ensured. The specific constructing method is as follows:

Step 31, setting a length $k_0$ of information bit of mother matrix, a length $n_0$ of integrally transmitted code word of the mother matrix, and size p of a cyclic block in the LDPC code; determining a length of information bit in the code word as $K_0=k_0*p$ and a length of the initially transmitted code word as $N_0=n_0*p$, determining a code rate of the initial transmission as $R_0=K_0/N_0$, and supposing the check matrix extend l*p bits each time, l being a integer no less than 1;

Step 32, constructing the mother matrix $M_0$ in the form shown by formula (16), constructing an $(N_0-K_0)*N_0$ order base check matrix $H_0$ by the power method for constructing the quasi-cyclic code, viz. the above mentioned Step 21 to Step 28, based on the mother matrix $M_0$, $H_0$ serving as the first layer of the check matrix;

Step 33, for the second layer of check matrix, using the bit-filling method or PEG method to construct a mother matrix $M_1$ on the basis of the mother matrix $M_0$ of the first layer of the check matrix $H_0$, wherein it is in the form as shown in the following formula (17):

$$M_1 = \begin{pmatrix} M_0 & 0 \\ C_{11} & C_{12} \end{pmatrix} \quad (17)$$

wherein $M_0$ is $(n_0-k_0)*n_0$ dimensional, $M_1$ is $(n_0-k_0+l)*(n_0+l)$ dimensional, $C_{11}$ is $l*n_0$ dimensional, and $C_{12}$ is a quasi-undertriangular matrix. Moreover, short block rings are arranged as few as possible in $M_1$ if it is allowed;

Step 34, as the construction of $M_1$ ensures a periphery as long as possible and a number of minimum rings as little as possible, generating cyclic permutation matrix by the power method for generating QC LDPC to substitute the positions of "1" in $C_{11}$ and $C_{12}$, so as to obtain $Q_1$ and $P_1$, so that it is possible to make the corresponding periphery as long as possible and the number of short ring length as little as possible if it is allowed, thereby obtaining the second layer of the corresponding check matrix as shown by the formula (18):

$$H_1 = \begin{pmatrix} H_0 & 0 \\ Q_1 & P_1 \end{pmatrix} \quad (18)$$

wherein $P_1$ is in the form of $H_p$ in the formula (2), viz. is a quasi-undertriangular matrix;

Step 35, by analogy, constructing the mth layer of a mother matrix sequentially in the structure as shown by the formula (19) with the method similar to Step 33 and Step 34, and constructing the mth layer of a corresponding check matrix in accordance with the following formula (20), wherein the constructed code rate is $k_0/(n_0+(m-1)l)$.

$$M_{m-1} = \begin{pmatrix} M_{m-2} & 0 \\ C_{m-1,1} & C_{m-1,2} \end{pmatrix} \quad (19)$$

$$H_{m-1} = \begin{pmatrix} H_{m-2} & 0 \\ Q_{m-1} & P_{m-1} \end{pmatrix} \quad (20)$$

Here, in the case of a short code or a code with moderate length, the QC LDPC code having said layered structure may also be constructed by using the general power method for constructing QC LDPC code.

The second step is: coding the data for pre-transmission by using the first layer of the check matrix.

Here, the data for pre-transmission is coded with the first layer of the check matrix having a structure as shown by formula (2), the first-layer-coded data code is $c_0[s\ p_1\ p_2]$, wherein s is a bit of known information, $p_1$, $p_2$ are check bits.

The third step is: performing second-layer-coding if the data transmitting terminal receives a NACK request for the first time.

In the formula (18), $H_0$ is in the form of a blocked matrix shown by the formula (3), therefore, a combined check matrix $H_1$ of the first layer and second layer can be obtained in the form as shown by the formula (21):

$$H_1 = \begin{pmatrix} A & B & T & 0 \\ C & D & E & 0 \\ Q_{11} & Q_{12} & Q_{13} & P_1 \end{pmatrix} \quad (21)$$

wherein $Q_1$ can be resolved into blocked matrix $[Q_{11}\ Q_{12}\ Q_{13}]$ having corresponding number of dimensions, $P_1$ is an lp×lp dimensional blocked matrix composed of cyclic permutation matrix. The complexity of coding may further be kept linear if $P_1$ is constructed as a quasi-undertriangular matrix.

Supposed the second-layer-coded data code is $c_1$, which is a set of code words $c_1=[s\ p_1\ p_2\ p_3]$ coded by $H_1$. $H_1\ c_1^T = 0^T$ can be resolved into the following three equations (22), (23), (24):

$$As^T + Bp_1^T + Tp_2^T = 0 \quad (22)$$

$$(-ET^{-1}A+C)s^T + (-ET^{-1}B+D)p_1^T = 0 \quad (23)$$

$$Q_{11}s^T + Q_{12}p_1^T + Q_{13}p_2^T + P_1p_3^T = 0 \quad (24)$$

And an equation (25) is derivable from the equation (24)

$$p_3^T = P_1^{-1}(Q_{11}s^T + Q_{12}p_1^T + Q_{13}p_2^T) \quad (25)$$

wherein s is a bit of known information, $p_1$ and $p_2$ are known results of the first-layer-coding. According to the formula 25, a quick coding method of B-LDPC code is used to finish the coding, and result $p_3$ of the second layer is sent. Coding of the added incremental redundant data has no influence on the sent code words, and the complexity of the coding remains linear.

Similarly, if the mth layer of the redundant data is retransmitted, $H_{m-1}$ has a structure as shown by the formula (26):

$$H_{m-1} = \begin{pmatrix} A & B & T & 0 & 0 & 0 \\ C & D & E & 0 & 0 & 0 \\ Q_{11} & Q_{12} & Q_{13} & P_1 & 0 & 0 \\ & & & \cdots & & \\ Q_{m-1,1} & Q_{m-1,2} & Q_{m-1,3} & \cdots & Q_{m-1,m+1} & P_{m-1} \end{pmatrix} \quad (26)$$

wherein m=N, the Nth layer of the matrix is the last line of $H_{m-1}$. Correspondingly, the coding result of the mth layer is:

$$p_{m+1}{}^T = P_{m-1}{}^{-1}(Q_{m-1,1}s^T + Q_{m-1,2}p_1{}^T + Q_{m-1,3}p_2{}^T + \ldots + Q_{m-1,m+1}p_m{}^T) \quad (27)$$

wherein s is a bit of known information, $p_1, p_2, p_3, \ldots, p_m$ are known coding results of the previous layer, the superscript T represents transpose, and the superscript −1 represents inversion.

The fourth step is: if the data transmitting terminal receives NACK request again, performing coding of next layer, and repeating the fourth step and the fifth step, until the transmitting terminal receives an ACK message representing a successful decoding of the receiving terminal or until a limited number of times of retransmission reaches.

Supposed now it is necessary to transmit redundant check data of the mth layer, coding is performed by using the mth layer of the constructed check matrix, the incremental redundant result of the coding is $p_{m+1}$. The fourth step and the fifth step are repeated until the transmitting terminal receives an ACK message representing a successful decoding of the receiving terminal or until limited number of times of retransmission reaches.

Figure 3:
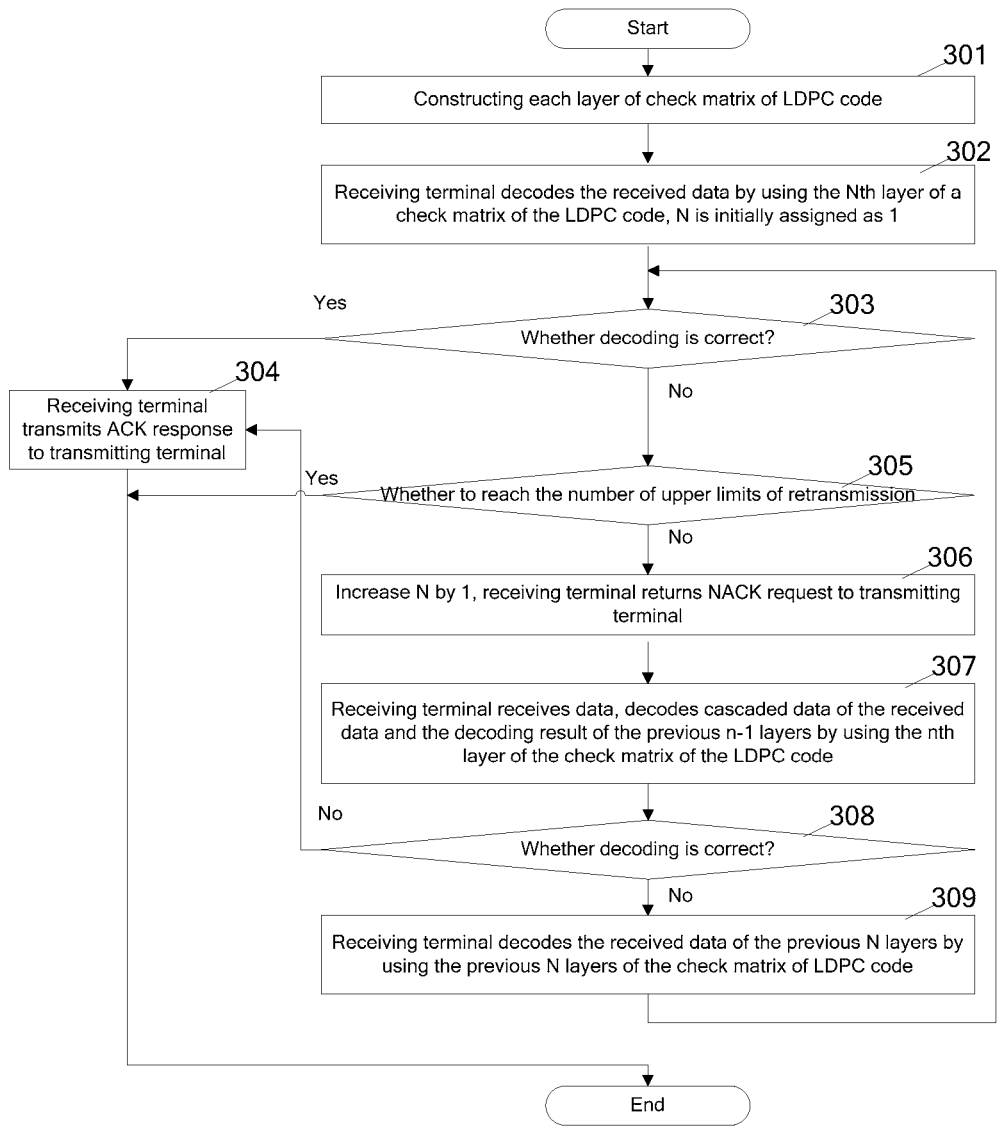
FIG. 3 is a flow chart of am embodiment of decoding of the present invention.

FIG. 3 is a flow chart of an embodiment of the decoding method of the present invention. See FIG. 3, said flow includes:

Step 301, constructing each layer of a check matrix of the layered LDPC code in accordance with service and retransmission HARQ mechanism;

Step 302, at the data receiving terminal, after testing the received data, performing decoding by using the Nth layer of a check matrix of the LDPC code. The initial value of N is 1;

Here, only the first layer of the check matrix is necessary for decoding data of the first layer, and the decoding may be carried out by parallel simplified BP decoding algorithm Step 303, judging whether the decoding is correct, conducting Step 304 if so, else, conducting Step 305;

Step 304, sending an ACK response representing a correct reception to the transmitting terminal, and terminating the flow;

Step 305, judging whether to reach a predetermined number of upper limit of retransmission, terminating the flow if so, else, conducting Step 306;

Step 305 is an optional step, and Step 306 may also be conducted directly after the failure of decoding is judged in Step 303.

Step 306, increasing the value of N by 1, sending a retransmission request, viz. NACK request, from the data receiving terminal to the data transmitting terminal;

After the reception of the retransmission data, the data receiving terminal layered-decodes the received data by using the Nth layer of the check matrix of the LDPC code. Two layered-decoding methods may be applied here, one of them is shown as FIG. 3 where the following Step 307 to Step 309 are conducted:

Step 307, the data receiving terminal receiving the retransmission data, decoding cascaded data of the received data for retransmission and the data of previous N−1 layers by using the Nth layer of the check matrix of the LDPC code. Here, the data for retransmission is just the data of the Nth layer. And "data of the previous N−1 layers" just refers to the data of all layers upper than the Nth layer;

It specifically includes: decoding the data of the previous N−1 layers by using the previous N−1 layers of the check matrix of the LDPC code, cascading the decoding result of data of the previous N−1 layers and the data of the Nth layer, decoding cascaded data of the decoding result of the previous N−1 layers and the Nth layer by using the Nth layer of the check matrix of the LDPC code. And "data of the previous N−1 layers" just refers to the data of all layers upper than the Nth layer;

Step 308, judging whether the decoding is correct, conducting Step 304 if so, else, conducting Step 309;

Step 309, combining the previous N−1 layers of the check matrix of the LDPC code and the Nth layer of the check matrix, decoding the cascaded data of the previous N−1 layers and the Nth layer by using the combined check matrix, and returning back to Step 303.

Another layered-decoding method as an alternative solution for the above mentioned Step 307 to Step 309 is:

Cascading the data of the previous N−1 layers and the data of the Nth layer, combining the previous N−1 layers of the check matrix of the LDPC code and the Nth layer of the check matrix, decoding the cascaded data by using the combined check matrix, and returning back to Step 303.

In the method contained in the decoding method of the present invention, when the data receiving terminal receives the data of the Nth layer, the data of the Nth layer may be cached and read from the cache during the sequential cascading process in the case of incorrect decoding.

The decoding method of the present invention does not limit the number of layers of the layered LDPC code, and the number of layers can be set according to the requirement of services.

Figure 4:
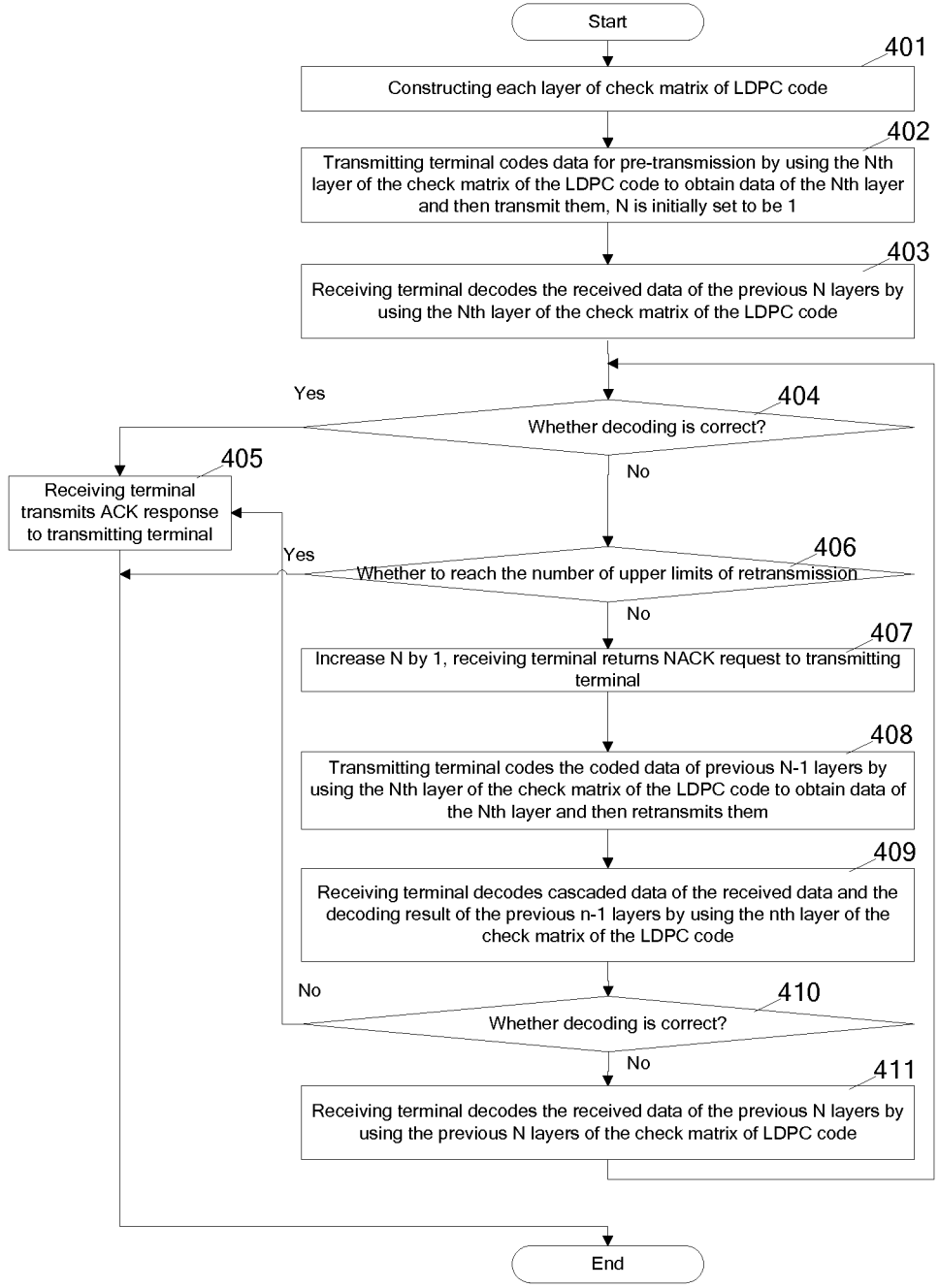
FIG. 4 is a flow chart of implementation of the coding process and the corresponding decoding process of the present invention.

FIG. 4 is a flow chart of implementation of the coding process and the corresponding decoding process of the present invention. Referring to FIG. 4, the flow chart of implementation of the coding process and the corresponding decoding process of the present invention includes:

Step 401, constructing each layer of a check matrix of the layered LDPC code in accordance with service and retransmission HARQ mechanism;

Step 402, the data transmitting terminal coding the data for pre-transmission by using the Nth layer of a check matrix of the LDPC code to obtain data of the Nth layer, and then sending them;

The initial value of N is 1, and this step is just coding the data for pre-transmission by using the first layer of the check matrix of the LDPC code to obtain the data of the first layer. In the step 402, it is unnecessary to perform second-layer-coding unless the data transmitting terminal receives a retransmission request, viz. NACK message.

Step 403, at the data receiving terminal, after testing the received data of the Nth layer, performing decoding by using the Nth layer of a check matrix of the LDPC code;

Here, only the first layer of the check matrix is necessary for decoding data of the first layer, and the decoding may be carried out by parallel simplified BP decoding algorithm;

Step 404, judging whether the decoding is correct, conducting Step 405 if so, else, conducting Step 406;

Step 405, send an ACK response representing a correct reception to the transmitting terminal, and terminating the flow;

Step 406, judging whether to reach the predetermined number of upper limits of retransmission, terminating the flow if so, else, conducting Step 407;

Step 407, increasing the value of N by 1, sending a retransmission request, viz. NACK request, from the data receiving terminal to the data transmitting terminal;

Step 408, the data transmitting terminal receiving the NACK request, performing Nth-layer-coding, viz. coding the coded data of the previous N−1 layers by using the Nth layer of the check matrix of the LDPC code to obtain data of the Nth layer, and then sending them. After sending the data of the (N−1)th layer, the data transmitting terminal caching them for coding the Nth layer, and deleting them if no NACK request is received.

For instance, for second-layer-coding, the coding result of the first layer is coded by using the second layer of the check matrix of the LDPC; for third-layer-coding, the coding result of the second layer and the previous coding results are coded by using the third layer of the check matrix of the LDPC; and the coding of each layer thereafter is performed by analogy.

After the reception of data, the data receiving terminal layered-decodes the received data by using the Nth layer of the check matrix of the LDPC code. Two layered-decoding methods may be applied here, one of them is shown as FIG. 4 in which the following Step 409 to Step 411 are conducted:

Step 409, the data receiving terminal decoding the cascaded data of the received data of the Nth layer and the data of the previous N−1 layers by using the Nth layer of the check matrix of the LDPC code;

It specifically includes: decoding the data of the previous N−1 layers by using the previous N−1 layers of the check matrix of the LDPC code, cascading the decoded data of the previous N−1 layers and the data of the Nth layer, decoding the cascaded data of the decoded data of the previous N−1 layers and the data of the Nth layer by using the Nth layer of the check matrix of the LDPC code.

Step 410, judging whether the coding is correct, conducting Step 405 if so, else, conducting Step 411;

Step 411, combining the previous N−1 layers of the check matrix of the LDPC code and the Nth layer of the check matrix, decoding the cascaded data of the previous N−1 layers and the Nth layer by using the combined check matrix, and returning back to Step 404.

Another layered-decoding method as an alternative solution for the above mentioned Step 401 to Step 411 is:

Cascading the data of the previous N−1 layers and the data of the Nth layer, combining the previous N−1 layers of the check matrix and the Nth layer of the check matrix of the LDPC code, decoding the cascaded data using the combined check matrix, and returning back to Step 404.

In the method contained in the method of the present invention, when the data receiving terminal receives the data of the Nth layer, the data of the Nth layer may be cached and read from the cache during the sequential cascading process in the case of incorrect decoding.

Figure 5:
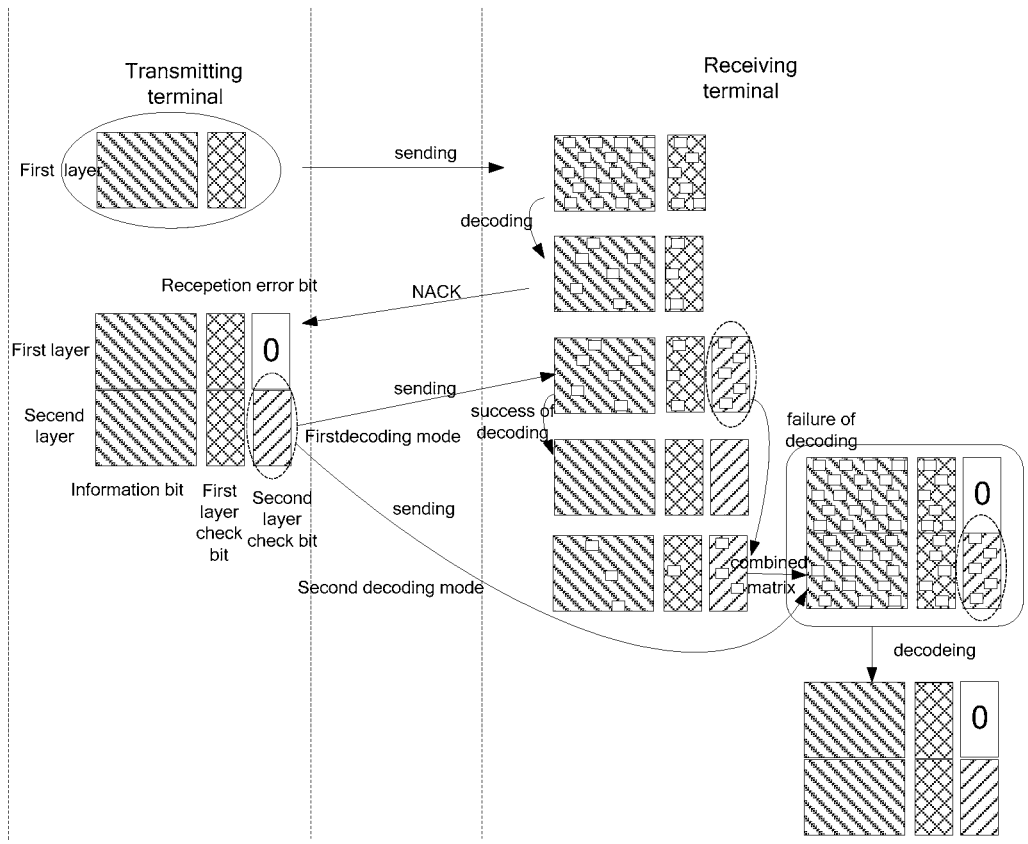
FIG. 5 is a schematic diagram of a decoding process of the layered LDPC code.

FIG. 5 is a schematic diagram of a decoding process of the layered LDPC code. In FIG. 5, the square with diagonals from top left to bottom right represents an information bit of the transmission data, the square with net-formed diagonals represents a check bit of the first layer of the transmission data, the square with diagonals from bottom left to top right represents a check bit of the second layer of the transmission data, and the blank square represents a reception error bit. Limited by the space, FIG. 5 just shows two layers of coding and decoding, and multilayer coding and decoding can be deduced directly from the situation shown in FIG. 5.

As mentioned above, two decoding methods are applicable at the data receiving terminal. (1) cascading the coded data of the first layer and the received data of the second layer, trying to use the second layer of the check matrix for decoding, sending an ACK response and terminating the process in the case of correct decoding; else, cascading the cached data of the first layer and the received data of the second layer, performing the decoding by using combination of the first layer and the second layer of the check matrix, sending an ACK response and terminating the process in the case of correct decoding; else, sending an NACK request to send incremental redundant information; (2) cascading the cached data of the first layer and the received data of the second layer, performing decoding by using combination of the check matrix of the first layer and the second layer of the check matrix, sending an ACK response and terminating the process in the case of correct decoding, else, sending an NACK request to send incremental redundant information.

The following processes are applied for the first decoding method:

Step 51, cascading the first-layered-coded code word $d_0$ and the received data $r_1$ of the second layer. Of course, a commonly known hard decision may also be conducted here to the first-layered-coded code word to eliminate a gain, and then the hard-decided code word $d_0$ is cascaded with the received data $r_1$ of the second layer;

Step 52, confidencal information of $c_0$ transferred in an additive white Gaussian noise (AWGN) channel being:

$$L(c_0^j) = \begin{cases} \dfrac{4*a}{\sigma^2} & \text{if } d_0^j = 0 \\ -\dfrac{4*a}{\sigma^2} & \text{if } d_0^j = 1 \end{cases} \quad (28)$$

wherein $d_0^j$ is the jth bit of $d_0$, $\sigma^2$ is variance of channel noise, $\alpha$ is a constant selected based on an average of the received data $r_1$ of the second layer.

Step 53, confidencal information of the received data $r_1$ of the second layer being:

$$L(r_1^j) = \dfrac{4*r_1^j}{\sigma^2} \quad (29)$$

Step 54, performing the decoding by using the second layer of the check matrix by the simplified BP algorithm based on the formula (28) and formula (29), sending an ACK response and terminating the process in the case of correct decoding; else, cascading the saved received data $r_0$ of the first layer and the received data $r_1$ of the second layer, performing the decoding by using the combined check matrix shown by the formula (21), sending an ACK response and terminating the process in the case of correct decoding; else, sending an NACK request to send incremental redundant information.

The second decoding method includes cascading the cached data $r_0$ of the first layer and the data $r_1$ of the second layer and performing decoding by using the combined check matrix shown by the formula (21).

In the case of reception of an NACK request, the data transmitting terminal performs coding of the next layer. Supposed now transmission of redundant check data of the mth layer is necessary, coding is performed by using the constructed mth layer of check matrix, wherein the coding incremental redundant result is $p_{m+1}$.

Correspondingly, the first decoding method is performed by the following processes:

Step 61, cascading the (m−1)th-layer-coded code word $d_{m-2}$ and the received data $r_{m-1}$ of the mth layer. Of course a hard decision may also be conducted to the (m−1)-layered-coded code word, and the cascading is performed after the hard decision.

Step 62, confidential information of $c_{m-2}$ transferred in an AWGN channel being:

$$L(c_{m-2}^j) = \begin{cases} \dfrac{4*a}{\sigma^2} & \text{if } d_{m-2}^j = 0 \\ -\dfrac{4*a}{\sigma^2} & \text{if } d_{m-2}^j = 1 \end{cases} \quad (30)$$

wherein $d_{m-2}^j$ is the jth bit of $d_{m-2}$, $\sigma^2$ is variance of channel noise, $\alpha$ is a constant selected based on an average of the received data $r_{m-1}$ of the mth layer.

Step 63, confidential information of the received data $r_{m-1}$ of the mth layer being:

$$L(r_{m-1}^j) = \dfrac{4*r_{m-1}^j}{\sigma^2} \quad (31)$$

Step 64, performing the decoding by using the mth layer of the check matrix with the simplified BP algorithm based on the formula (30) and formula (31), sending an ACK response and terminating the process in the case of correct decoding; else, cascading all the cached upper-layer data $r_0, r_1, \ldots, r_{m-2}$ and the received data $r_{m-1}$ of the mth layer, performing the decoding by using the combined check matrix shown by the formula (26), sending an ACK response and terminating the process in the case of correct decoding; else, sending an NACK request to send incremental redundant information.

The second decoding method includes cascading all the cached upper-layer data $r_0, r_1, \ldots, r_{m-2}$ and the received data $r_{m-1}$ and the received data $r_{m-1}$ of the mth layer and performing the decoding by using the combined check matrix shown by the formula (26).

Now, the performances of the above mentioned two decoding methods are compared in detail. a QC LDPC code is applied wherein the information bit has length of $K_0=508$, the code rates of each of the first layer, second layer and third layer are respectively 4/8, 4/14, 4/20, the code rate of the mother code is 4/8, a data length of 127*6 is retransmitted each time, and the simplified mother matrix constructing method is used, and the cyclic permutation block is in a size of 127*127. The performance of the first decoding method is compared with that of the second decoding method in the follows. Since the decoded data of the first layer is cascaded with the received data of the second layer and the second layer of the check matrix is used for decoding in the first decoding method, the first decoding method is also called "monolayer decoding"; and the second decoding method is also called "complete decoding".

The following table 1 shows the simulation results of the probability of successful decoding of the two methods:

TABLE 1

| signal to noise ratio (dB) | monolayer decoding (%) | complete decoding (%) |
|---|---|---|
| 0.6 | 12 | 100 |
| 0.8 | 41 | 100 |
| 1 | 71 | 100 |
| 1.2 | 87.8 | 100 |
| 1.4 | 93.1 | 100 |
| 1.6 | 85.1 | 100 |
| 1.8 | 86.2 | 100 |

The following table 2 shows the simulation results of the average times of decoding iteration of the two methods.

TABLE 2

| signal to noise ratio (dB) | monolayer decoding | complete decoding |
|---|---|---|
| 0.6 | 21.12 | 9.07 |
| 0.8 | 14.68 | 8.39 |
| 1 | 10.15 | 7.96 |
| 1.2 | 6.65 | 7.50 |
| 1.4 | 6.30 | 7.00 |
| 1.6 | 6.07 | 6.64 |
| 1.8 | 5.52 | 6.30 |

It can be seen from the results of the table 1 and table 2: (1) regarding the probability of successful decoding, when the first decoding method is used at a signal to noise ratio of 1 dB-0.6 dB, the probability of successful decoding by using a monolayer of check matrix reduces along with the depravation of the channel quality; and in the case of a signal to noise ratio between 1.2 dB and 1.8 dB, probability of successful decoding by using the monolayer check matrix reaches 85% and more; while the entire check matrix is applied in the second decoding method, under the condition of identical signal to noise ratios, the probability of successful decoding reaches 100%; (2) regarding the times of decoding iteration, at a signal to noise ratio of 1.2 dB-1.8 dB, the average times of iteration is 6.135 when a monolayer of check matrix is used for decoding, while the average times of iteration is 6.86 when the entire check matrix is used for decoding, the latter carries out 0.725 times more than the former. Regarding the complexity of decoding, the complexity of each time of iteration is directly proportional to the number of 1 in the check matrix, and the check matrices applied in the two kinds of decoding are quite different, that is, one layer of the entire layered check matrix is applied for decoding by a monolayer of the check matrix, while the entire check matrix is applied for the entire decoding, hence the complexity of decoding by a monolayer of the check matrix is far too smaller than that of decoding by the entire check matrix.

It can be seen from the above analysis that the probability of successful decoding of the first decoding method is quite high and it integrally reduces the complexity of the algorithm in good condition of channels; at a signal to noise ratio of 1 dB-0.6 dB, the probability of successful decoding of the first decoding method decreases relative rapidly and the number of the decoding iteration increases rapidly along with the reduction of the signal to noise ratio, thus, now it is meaningless to apply the monolayer of the check matrix for decoding, and the second decoding method may be applied now for decoding.

In a real system, which decoding solution is to be applied may be decided based on the communication channel quality of the receiving terminal, e.g. based on an evaluation value of the signal to noise ratio. Therefore, a pre-determined standard of channel quality of the communication channel may be preset for the method of the present invention, e.g. presetting an evaluation value of the signal to noise ratio. Before decoding, it is further judged whether the channel quality of the current communication channel reaches the preset standard. If so, the first decoding method is applied for decoding, else, the second decoding method is applied for decoding.

Figure 6:
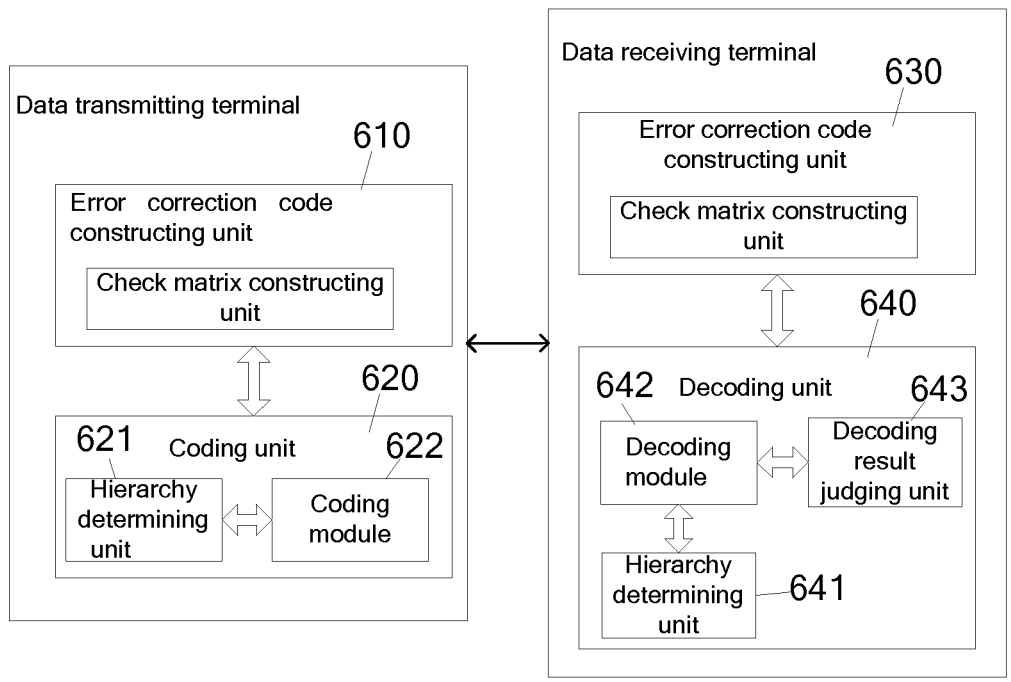
FIG. 6 is a schematic structure diagram of the coding and decoding communication system of the present invention.

Based on the above mentioned coding and decoding methods, the present invention further discloses a coding and decoding communication system based on LDPC code. FIG. 6 is a schematic structure diagram of the coding and decoding communication system. Referring to FIG. 6, the coding and decoding communication system of the present invention includes data transmitting terminal and data receiving terminal, wherein the data transmitting terminal includes a coding device, and the data receiving terminal includes a decoding device.

Wherein the coding device includes an error correcting code constructing unit 610 and a coding unit 620, wherein:

The error correcting code constructing unit 610 is used for constructing an LDPC code used as an error correcting code. The error correcting code constructing unit 610 may be provided at both the data transmitting terminal and the data receiving terminal simultaneously, it may also be provided at one of the terminals and send the constructed LDPC code to the other terminal by message interaction.

The coding unit 620 is provided at the data transmitting terminal of the hybrid ARQ system, and includes a coding module 622 for coding the data for pre-transmission by using the LDPC code constructed by the error correcting code constructing unit 610; the coded data is sent to the data receiving terminal by the transmitting unit of the communication system. As the transmitting unit belongs to commonly knowledge of the art, it is not shown in FIG. 6.

The LDPC code constructed by the device of the present invention has a layered structure, the error correcting code constructing unit 610 includes specifically a check matrix constructing unit for constructing each layer of check matrix of the layered LDPC code. Regarding the exact constructing method, the method of the above mentioned Step 31 to Step 35 may be taken in consideration.

The coding unit 620 further includes a hierarchy determining unit for determining the hierarchy of coding; in the case of initially sent data, the coding module 622 is triggered to perform first-layer-coding of the data by using the first layer of the check matrix of the LDPC code; in the case of data for (n−1)th retransmission sent by the data transmitting terminal, the hierarchy n of coding is determined, the coding module is triggered to nth-layer-cod the coded data of the previous n−1 layers by using the nth layer of the check matrix, wherein n is an integer no less than 2.

Wherein the decoding device includes an error correcting code constructing unit 630 and a decoding unit 640, wherein:

The error correcting code constructing unit 630 is used for constructing an LDPC code used as an error correcting code. The error correcting code constructing unit 630 may be provided at both the data transmitting terminal and the data receiving terminal simultaneously, it may also be provided at one of the terminals and send the constructed LDPC code to the other terminal by message interaction.

The decoding unit 640 is provided at the data receiving terminal of the hybrid ARQ system and includes a decoding module 642 for decoding the received data by using the LDPC code constructed by the error correcting code constructing unit 630.

The LDPC code constructed by the device of the present invention has a layered structure, the error correcting code constructing unit 630 includes specifically a check matrix constructing unit for constructing each layer of check matrix of the layered LDPC code. Regarding the exact constructing method, the method of the above mentioned Step 31 to Step 35 may be taken in consideration.

The decoding unit further includes a hierarchy determining unit 641 and a decoding result judging unit 643, the hierarchy determining unit 641 is used for determining a hierarchy N. In the case of reception of initial transmission data at the data receiving terminal, the decoding module is triggered to layered-decode the received data by using the first layer of the check matrix of the LDPC, in the case of reception of data for (n−1)th retransmission at the data receiving terminal, the hierarchy n is determined, and the decoding module is triggered to layered-decode the received data by using the nth layer of the check matrix of the LDPC code, wherein n is an integer no less than 2; the decoding result judging unit 643 is used for judging the decoding result, in the case of incorrect decoding, the value of N increase by 1 and the data receiving terminal is triggered to send a retransmission request to the data transmitting terminal The decoding module 642 further includes a first decoding module and a second decoding module, and the decoding result judging unit further comprises a first decoding result judging unit and a second decoding result judging unit, wherein:

The first decoding module is used for decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code, and outputting decoding result to the first decoding result judging unit;

The first decoding result judging unit is used for judging the decoding result and triggering the second decoding unit in the case of incorrect decoding;

The second decoding module is used for cascading the data of the previous n−1 layers and the data of the nth layer, combining the previous n−1 layers of the check matrix of the LDPC code and the nth layer of the check matrix, decoding the cascaded data of the previous n−1 layers and the nth layer by using the combined check matrix, and outputting the decoding result to the second decoding result judging unit;

The second decoding result judging unit is used for judging the decoding result, and informing the data transmitting terminal of retransmitting the data in the case of incorrect decoding.

Figure 7:
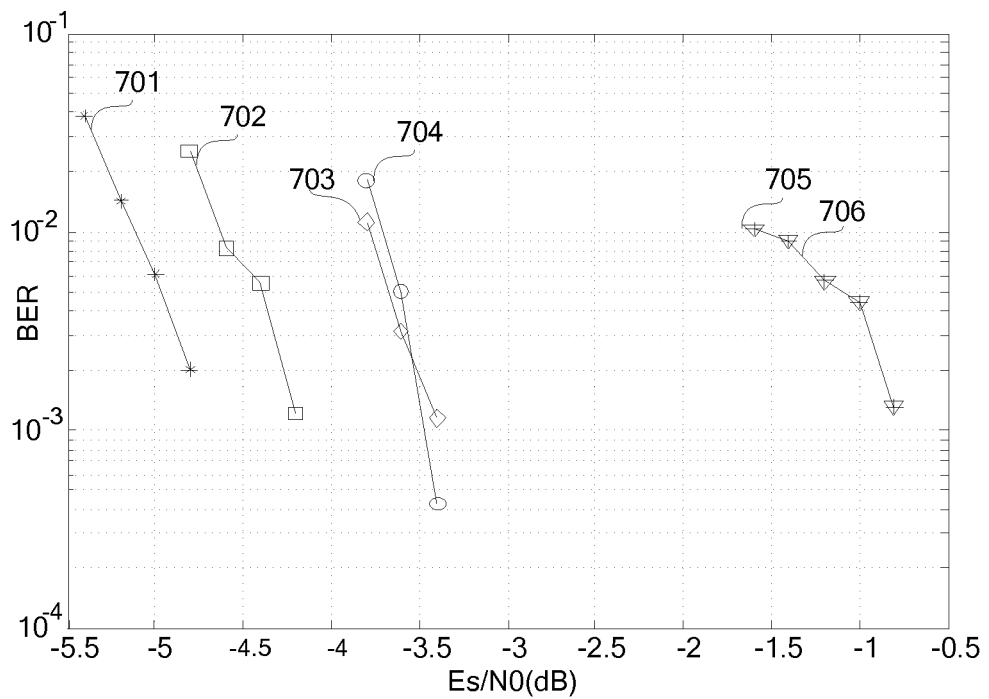
FIG. 7 is a schematic diagram of performance simulation of the layered LDPC code of the present invention.

FIG. 7 is a schematic diagram of performance simulation of the layered LDPC code of the present invention. Referring to FIG. 7, supposed that a QC LDPC code is applied wherein the information bit has a length of $K_0=508$, the code rate of each of the first layer, second layer and third layer is respectively 4/8, 4/14, 4/20, the code rate of the mother code is 4/8, a data length of 127*6 is retransmitted each time, and the simplified mother matrix constructing method is used. Wherein, the cyclic permutation block is in a size of 127*127. In FIG. 7, the abscissa indicates symbol energy/noise (Es/N0), the ordinate indicates bit error rate (BER) which shows performance parameter of the LDPC code. The trajectory 701 represents the performance of a B-LDPC code with a code rate of 508/2540, the trajectory 702 represents the performance of a HARQ-based LDPC code with a code rate of 508/2540, the trajectory 703 represents the performance of a HARQ-based LDPC code with a code rate of 508/1778, the trajectory 704 represents the performance of a B-LDPC code with a code rate of 508/1778, the trajectory 705 represents the performance of a HARQ-based LDPC code with a code rate of 508/1016, and the trajectory 706 represents the performance of a B-LDPC code with a code rate of 508/1016. Moreover, the trajectory 705 and the trajectory 706 overlap each other in FIG. 7.

It can be seen from the simulation result in FIG. 7 that the performance of the layered LDPC code constructed based on HARQ technology is substantively in consistency with that of the integrally optimized B-LDPC at a relative high code rate. However, with reduction of the code rate, the performance of said method decreases somewhat as compared with the B-LDPC code, and it reduces about 0.6 dB at a code rate of 0.2. B-LDPC is an integrally optimized LDPC code, and the HARQ-based layered LDPC adopts optimally constructed layered LDPC code. Thus, the present invention commendably satisfies the composite demand on the aspects such as performance, complexity, and code delay in the implementation of coding, while substantively ensuring the coding performance and relative low coding complexity.

Figure 8:
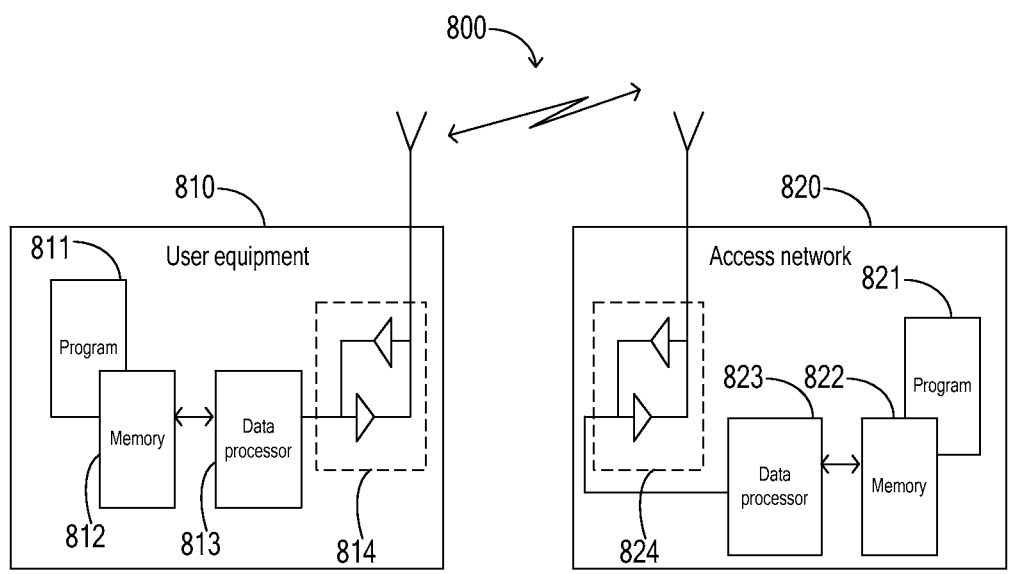
FIG. 8 is a structural flow chart of an electronic device implementing the coding and decoding embodiments of the present invention.

FIG. 8 is a structural flow chart of an electronic device implementing the coding and decoding embodiments of the present invention. In FIG. 8, user equipment 810 realizes communication by access to an access network 820. The user equipment 810 includes a data processor 813, a memory 812 connected to the data processor 813, and a wireless transceiver 814 capable of receiving and transmitting. The user equipment 810 realizes intercommunication with the access network 820 via the wireless transceiver 814. The memory 812 has program 811 stored thereon. The access network 820 includes a data processor 823, a memory 822 connected to the data processor 823, and a wireless transceiver 824 capable of receiving and transmitting. The access network 820 realizes intercommunication with the user equipment 810 via the wireless transceiver 824. The memory 822 has program 821 stored thereon. The access network 820 connects to one or more external networks or systems, such as mobile communication system or Internet, through data channels. A part of said contents is not shown in FIG. 8 as being commonly knowledge of the art.

The data processor 813 and the data processor 823 execute the corresponding program 811 and program 821 which contain program instruction therein for implementing the above described embodiment of the present invention to realize coding and decoding of low-density parity-check (LDPC) code. The embodiment of the present invention can be realized via the data processor 813 and data processor 823 in the user equipment 810 and the access network 820 by executing computer software program, or realized via hardware or in the form of combination of software and hardware.

Evidently, the user equipment 810 in this embodiment includes but is not limited to the following equipment: user terminal equipment such as mobile phone, personal digital assistant (PDA), laptop and so on. The access network 820 in this embodiment includes but is not limited to the following equipment: access network equipment connecting with the system to which the user accesses, such as base station, AP (Access Point) of a wireless local network and so on.

Based on the above coding method, the present invention further provides a computer program for executing the coding method in the above embodiment.

Based on the above coding method, the present invention further provides a computer readable medium for carrying a computer program executing the coding method in the above embodiment.

Based on the above decoding method, the present invention further provides a computer program for executing the decoding method in the above embodiment.

Based on the above decoding method, the present invention further provides a computer readable medium for carrying a computer program executing the decoding method in the above embodiment.

The cited term "computer readable medium" refers to an optional medium providing program to be executed to the data processor. Such a medium may be in various forms, including but not limited to nonvolatile medium, volatile medium, and transmission medium. The nonvolatile medium includes e.g. memory device such as optical disc or magnetic disk, and the volatile medium includes main memory such as dynamic memory.

The transmission medium includes coaxial cable, copper line and optical fiber, including lines containing bus. The transmission medium may also be embodied in acoustic, optical form, or in the form of electromagnetic wave, as those generated in RF and IR data communication. The computer readable medium is usually in the form of e.g. diskette, floppy disk, hard disk, tape or any other magnetic medium or CD-ROM, CDRW, DVD or any other optical medium or punched card, punched tape, optical mark reader paper or any physical medium punched or identifiably tagged or RAM, PROM, and EPROM, FLASH-EPROM or any other memory feature or cassette or carrier wave, or any other computer readable medium. Computer readable media in different form can be used for providing program to be executed to the data processor. For example, a program for carrying out at least part of the present invention may be initially generated on a magnetic disc of a remote computer.

The above is just preferable embodiments of the present invention. It should be indicated that the person skilled in the art is capable to carry out several improvement and retouch without deviating from the principle of the present invention, and these improvement and retouch shall also be considered as being within the scope of protection of the present invention.

What is claimed is:

1. A method for coding of a LDPC code, comprising:
   A. constructing each layer of check matrix of the layered LDPC code used as an error correcting code;
   B. prior to initially sending data by a data transmitting terminal, performing first-layer-coding of the data to be sent by using a first layer of the check matrix of the LDPC code, sending the first-layer-coded data;
   C. prior to sending data for (n−1)th retransmission by the data transmitting terminal, performing nth-layer-coding of the data by using an nth layer of the check matrix of the LDPC code;
   D. sending the nth-layer-coded data, wherein n is an integer no less than 2, wherein the method for constructing each layer of check matrix of the layered LDPC code of step A is a method for constructing a quasi-cyclic LDPC code and the step A comprises:
   A1. setting parameters of a mother matrix;
   A2. constructing the mother matrix $M_0$ based on the set parameters; constructing a base check matrix $H_0$ based on the mother matrix $M_0$ by power method for constructing quasi-cyclic code, the base check matrix $H_0$ serving as the first layer of the check matrix;
   A3. setting an initial value of m to be 2;
   A4. constructing a mother matrix $M_{m-1}$ of the mth layer of the check matrix;

A5. generating a cyclic permutation matrix by power method to substitute a selected block in $M_{m-1}$, so that the mth layer of a check matrix $H_{m-1}$ is obtained;

A6. judging whether m reaches a predetermined value, terminating this procedure if so; else, increasing the value of m by 1 and returning back to step A4, and wherein the method for constructing each layer of the check matrix of the layered LDPC code is a bit-filling method or a progressive edge-growth algorithm, and wherein the data for the coding in step C are the coded data of all previous n−1 layers;

the nth-layer-coding of the data by using the nth layer of the check matrix of the LDPC code in step C is specifically:

determining structures of previous n layers of check matrix $H_{m-1}$ in accordance with the formula:

$$H_{m-1} = \begin{pmatrix} A & B & T & 0 & 0 & 0 \\ C & D & E & 0 & 0 & 0 \\ Q_{11} & Q_{12} & Q_{13} & P_1 & 0 & 0 \\ & & & \cdots & & \\ Q_{m-1,1} & Q_{m-1,2} & Q_{m-1,3} & \cdots & Q_{m-1,m+1} & P_{m-1} \end{pmatrix},$$

wherein m=n, and the nth layer of the check matrix is the last line of $H_{m-1}$; and determining a coding result $p_{m+1}^T$ of the mth layer in accordance with the formula: $p_{m+1}^T = P_{m-1}^{-1}(Q_{m-1,1}s^T + Q_{m-1,2}p_1^T + Q_{m-1,3}p_2^T + \ldots + Q_{m-1,m+1}p_m^T)$, wherein s is a known information bit, $p_1, p_1, p_3, \ldots, p_m$ are known coding results of coding of upper layers relative to the mth layer, the superscript T represents transpose, and the superscript −1 represents inversion, and the LDPC code of said each layer is a block-type LDPC code.

2. A computer program for executing the coding method according to claim 1.

3. A computer-readable medium for carrying the computer program for executing the coding method according to claim 1.

4. A method for decoding of a LDPC code, comprising:

E. pre-constructing and storing each layer of a check matrix of a layered LDPC code;

F. after a data receiving terminal receives initially sent data of the first layer, decoding the received data by using a first layer of the check matrix of the LDPC code and judging the decoding result, and informing the data transmitting terminal of retransmitting the data in the case of incorrect decoding;

G. after the data receiving terminal receives data for (n−1)th retransmission, layered-decoding the received data by using an nth layer of the check matrix of the LDPC code;

judging the decoding result, and informing the data transmitting terminal of retransmitting the data in the case of incorrect decoding, wherein n is an integer no less than 2, wherein the step F comprises:

F1. decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code;

F2. judging the decoding result of the step F1, cascading the data of the previous n−1 layers and the data of the nth layer in the case of incorrect decoding, combining the previous n−1 layers of the check matrix and the nth layer of the check matrix of the LDPC code, decoding the cascaded data of the previous n−1 layers and the nth layer by using the combined check matrix, and judging the decoding result, informing the data transmitting terminal of retransmitting the data in the case of incorrect decoding; and F3. cascading the data of the previous n−1 layers with the data of the nth layer, combining the previous n−1 layers of the check matrix and the nth layer of the check matrix of the LDPC code, and decoding the cascaded data by using the combined check matrix.

5. The method for decoding of a LDPC code according to claim 4, wherein said method further includes: judging whether channel quality of a current channel reaches a predetermined standard, if so, the step F being specifically:

F1. decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code;

F2. judging the decoding result of the step F1, cascading the data of the previous n−1 layers and the data of the nth layer in the case of incorrect decoding, combining the previous n−1 layers of the check matrix and the nth layer of the check matrix of the LDPC code, decoding the cascaded data of the previous n−1 layers and the data of the nth layer by using the combined check matrix, and judging the decoding result, informing the data transmitting terminal of retransmitting the data in the case of incorrect decoding;

if the channel quality of the current channel fails to reach the predetermined standard, the step F being specifically:

F3. cascading the data of the previous n−1 layers with the data of the nth layer, combining the previous n−1 layers of the check matrix and the nth layer of the check matrix, and decoding the cascaded data by using the combined check matrix.

6. The method for decoding of a LDPC code according to claim 4, wherein the constructing method of the step D is: a method for constructing a quasi-cyclic LDPC code; and the step D includes specifically:

H1. setting parameters of a mother matrix;

H2. constructing the mother matrix $M_0$ based on the set parameters; constructing a base check matrix $H_0$ based on the mother matrix $M_0$ by power method for constructing quasi-cyclic code, the base check matrix $H_0$ serving as the first layer of the check matrix;

H3. setting an initial value of m to be 2;

H4. constructing a mother matrix $M_{m-1}$ of the mth layer of the check matrix;

H5. generating a cyclic permutation matrix by power method to substitute a selected block in $M_{m-1}$, so that the mth layer of a check matrix $H_{m-1}$ is obtained;

H6. judging whether m reaches a predetermined value, terminating this procedure if so; else, increasing the value of m by 1 and returning back to step D4;

wherein the method for constructing each layer of the check matrix of the layered LDPC code is a bit-filling method or a progressive edge-growth algorithm, and the LDPC code of said each layer is a block-type LDPC code.

7. A computer program for executing the method for decoding according to claim 6.

8. A computer-readable medium for carrying the computer program for executing the method for decoding according to claim 6.

9. A device for decoding a LDPC code, comprising:
an error correcting code constructing unit for constructing each layer of a check matrix of a layered LDPC code used as an error correcting code;
a decoding unit provided at a data receiving terminal for layered-decoding the received data by using the layered LDPC code constructed by the error correcting code constructing unit, wherein the decoding unit includes specifically a decoding module, a hierarchy determining unit, and a decoding result judging unit,
the decoding unit being used for decoding,
the hierarchy determining unit being used for determining hierarchy of decoding, after the data receiving terminal receives the initially sent data, the decoding module being triggered to layered-decoding the received data by using the first layer of the check matrix of the LDPC code; after the data receiving terminal receives data for (n−1)th retransmission, hierarchy n being determined, the decoding module being triggered to layered-decoding the received data by using the nth layer of the check matrix of the LDPC code, wherein n is an integer no less than 2,
the decoding result judging unit being used for judging the decoding result and informing the data transmitting terminal of retransmitting the data in the case of incorrect decoding, and
wherein the decoding module further includes a first decoding module and a second decoding module, and the decoding result judging unit further includes a first decoding result judging unit and a second decoding result judging unit, wherein,
the first decoding module is used for decoding data of previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code, and outputting the decoding result to the first decoding result judging unit,
the first decoding result judging unit is used for judging the decoding result and triggering the second decoding module in the case of incorrect decoding,
the second decoding module is used for cascading the data of the previous n−1 layers and the data of the nth layer, combining the previous n−1 layers of the check matrix and the nth layer of the check matrix of the LDPC code, decoding the cascaded data of the previous n−1 layers and the nth layer by using the combined check matrix, and outputting the decoding result to the second decoding result judging unit,
the second decoding result judging unit is used for judging the decoding result, and informing the data transmitting terminal of retransmitting the data in the case of incorrect decoding, and
wherein the LDPC code of said each layer is a block-type LDPC code.

10. An electronic device comprising: at least one data processor, at least one memory connected with the data processor; and a coder connected with the data processor; wherein the coder is used for constructing each layer of a check matrix of a layered LDPC code used as an error correcting code and, prior to initially sending data, performing first-layer-coding of the data to be sent by using a first layer of the check matrix of the LDPC code and, prior to sending data for (n−1)th retransmission, performing nth-layer-coding of the data by using an nth layer of the check matrix of the LDPC code, wherein the method for constructing the layered LDPC is a method for constructing a quasi-cyclic LDPC code, specifically comprising the following steps:

G1. setting parameters of a mother matrix;
G2. constructing the mother matrix $M_0$ based on the set parameters; constructing a base check matrix $H_0$ based on the mother matrix $M_0$ by power method for constructing quasi-cyclic code, the base check matrix $H_0$ serving as the first layer of the check matrix:
G3. setting an initial value of m to be 2;
G4. constructing a mother matrix $M_{m-1}$ of the mth layer of the check matrix;
G5. generating a cyclic permutation matrix by power method to substitute a selected block in $M_{m-1}$, so that the mth layer of a check matrix $H_{m-1}$ is obtained; and
G6. judging whether m reaches a predetermined value, terminating this procedure if so; else, increasing the value of m by 1 and returning back to step G4.

11. An electronic device, comprising: at least one data processor; at least one memory connected with the data processor; and a decoder connected with the data processor, wherein
the decoder is used for pre-constructing and storing each layer of a check matrix of a layered LDPC code and, after a data receiving terminal receives initially sent data of the first layer, decoding the received data by using a first layer of the check matrix of the LDPC code and judging the decoding result, informing the data transmitting terminal of retransmitting the data in the case of incorrect decoding, and, after the data receiving terminal receives data for (n−1)th retransmission, layered-decoding the received data by using an nth layer of the check matrix of the LDPC code; judging the decoding result, informing the data transmitting terminal of retransmitting the data in the case of incorrect decoding, wherein n is an integer no less than 2, wherein after reception of the data for (n−1)th retransmission, it conducts the following:

H1. decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code;
H2. judging the decoding result of the step H1, cascading the data of the previous n−1 layers and the data of the nth layer in the case of incorrect decoding, combining the previous n−1 layers of the check matrix and the nth layer of the check matrix of the LDPC code, decoding the cascaded data of the previous n−1 layers and the nth layer by using the combined check matrix, and judging the decoding result, informing the data transmitting terminal of retransmitting the data in the case of incorrect decoding, and
wherein after reception of the data for (n−1)th retransmission, it conducts the following step:
H3. cascading the data of the previous n−1 layers with the data of the nth layer, combining the previous n−1 layers of the check matrix and the nth layer of the check matrix of the LDPC code, and decoding the cascaded data by using the combined check matrix.

12. The electronic device according to claim 11, wherein after reception of the data for (n−1)th retransmission, it further conducts the following step: judging whether channel quality of a current channel reaches a predetermined standard, conducting the following step if so:

H1. decoding the data of the previous n−1 layers by using the previous n−1 layers of the check matrix of the LDPC code, cascading the decoding result of the data of the previous n−1 layers and the data of the nth layer, decoding the cascaded data of the decoding result of the data of the previous n−1 layers and the data of the nth layer by using the nth layer of the check matrix of the LDPC code;

H2. judging the decoding result of the step H1, cascading the data of the previous n−1 layers and the data of the nth layer in the case of incorrect decoding, combining the previous n−1 layers of the check matrix and the nth layer of the check matrix of the LDPC code, decoding the cascaded data of the previous n−1 layers and the nth layer by using the combined check matrix, judging the decoding result, and informing the data transmitting terminal of retransmitting the data in the case of incorrect decoding;

and cascading the data of the previous n−1 layers with the data of the nth layer, combining the previous n−1 layers of the check matrix and the nth layer of the check matrix of the LDPC code, and decoding the cascaded data by using the combined check matrix if the channel quality of the current channel fails to reach the predetermined standard, and wherein the electronic device is selected from the group consisting of a mobile electronic device, a mobile phone, a base station and an access point AP of a wireless local network.

* * * * *